United States Patent
Mueller et al.

(10) Patent No.: US 10,818,831 B2
(45) Date of Patent: *Oct. 27, 2020

(54) METHOD FOR PRODUCING A THERMOELECTRIC OBJECT FOR A THERMOELECTRIC CONVERSION DEVICE

(71) Applicant: VACUUMSCHMELZE GMBH & CO. KG, Hanau (DE)

(72) Inventors: Michael Mueller, Woerth (DE); Alberto Bracchi, Hanau (DE); Joachim Gerster, Alzenau (DE)

(73) Assignee: VACUUMSCHMELZE GMBH & CO. KG, Hanau (DE)

( * ) Notice: Subject to any disclaimer, the term of this patent is extended or adjusted under 35 U.S.C. 154(b) by 649 days.

This patent is subject to a terminal disclaimer.

(21) Appl. No.: 14/881,219

(22) Filed: Oct. 13, 2015

(65) Prior Publication Data

US 2016/0190421 A1 Jun. 30, 2016

(30) Foreign Application Priority Data

Oct. 13, 2014 (DE) .................. 10 2014 114 830

(51) Int. Cl.

| | |
|---|---|
| *H01L 35/34* | (2006.01) |
| *B22F 9/04* | (2006.01) |
| *B22F 3/10* | (2006.01) |
| *C22C 14/00* | (2006.01) |
| *C22C 16/00* | (2006.01) |
| *C22C 19/00* | (2006.01) |
| *H01L 35/20* | (2006.01) |
| *B22F 3/12* | (2006.01) |
| *C22C 13/00* | (2006.01) |
| *C22C 30/04* | (2006.01) |
| *C22F 1/00* | (2006.01) |

(52) U.S. Cl.
CPC .............. *H01L 35/34* (2013.01); *B22F 3/10* (2013.01); *B22F 3/12* (2013.01); *B22F 9/04* (2013.01); *C22C 13/00* (2013.01); *C22C 14/00* (2013.01); *C22C 16/00* (2013.01); *C22C 19/00* (2013.01); *C22C 30/04* (2013.01); *C22F 1/00* (2013.01); *H01L 35/20* (2013.01); *B22F 2009/044* (2013.01); *B22F 2009/045* (2013.01)

(58) Field of Classification Search
CPC ... B22F 3/12; B22F 9/04; H01L 35/16; H01L 35/34
USPC .......................................... 419/33
See application file for complete search history.

(56) References Cited

U.S. PATENT DOCUMENTS

| | | | |
|---|---|---|---|
| 9,634,219 B2* | 4/2017 | Gerster .................. | H01L 35/20 |
| 2007/0125416 A1* | 6/2007 | Iwanade ................ | H01L 35/16 |
| | | | 136/236.1 |
| 2014/0314610 A1* | 10/2014 | Gerster .................. | H01L 35/20 |
| | | | 419/28 |

FOREIGN PATENT DOCUMENTS

| | | |
|---|---|---|
| DE | 102006057750 A1 | 8/2007 |
| WO | 2011012548 A2 | 2/2011 |

OTHER PUBLICATIONS

Office Action on German Application No. DE102014114830.4 dated Jun. 17, 2015.

* cited by examiner

*Primary Examiner* — Weiping Zhu
(74) *Attorney, Agent, or Firm* — Dickinson Wright PLLC

(57) ABSTRACT

A method for producing a thermoelectric object for a thermoelectric conversion device is provided. A starting material which has elements in the ratio of a half-Heusler alloy is melted and then cooled to form at least one ingot. The ingot is homogenized at a temperature of 1000° C. to 1400° C. for a period of time t, wherein 0.5 h≤t<12 h or 24 h<t<100 h. The homogenized ingot is crushed and ground into a powder. The powder is cold-pressed and sintered at a maximum pressure of 1 MPa for 0.5 to 24 h at a temperature of 1000° C. to 1500° C.

26 Claims, 6 Drawing Sheets

METHOD FOR PRODUCING A THERMOELECTRIC OBJECT FOR A THERMOELECTRIC CONVERSION DEVICE

This application claims benefit of DE 10 2014 114 830.4, filed 13 Oct. 2014, the entire contents of which are incorporated herein by reference for all purposes.

BACKGROUND

1. Field

The disclosure relates to a method for producing a thermoelectric object for a thermoelectric conversion device, in particular a method for producing a thermoelectric object from a half-Heusler alloy.

2. Description of Related Art

Thermoelectric conversion devices use the Seebeck effect for obtaining electricity from heat that is typically wasted. A requisite for the wider use of the thermoelectric effect to convert heat into electric energy is the availability of efficient thermoelectric materials.

The efficiency of a thermoelectric material is described by its ZT value, which is defined by $ZT=TS^2\sigma/\kappa$. Here, T is the absolute temperature, S is the Seebeck coefficient, $\sigma$ is the electrical conductivity and $\kappa$ is the thermal conductivity. Half-Heusler alloys are considered to be a class of materials with promising potential for high ZT values. U.S. Pat. No. 7,745,720 B2, for example, discloses half-Heusler alloys for thermoelectric conversion devices.

Half-Heusler alloys represent intermetallic compounds of the general formula XYZ with an ordered cubic $C1_b$ crystal structure. Each of the transition metals X, Y and a main group metal Z occupy one of three nested face-centered cubic (fcc) sublattices. A fourth fcc sublattice is unoccupied. If the sum of the valence electrons in this structure is 18, the compound exhibits a semi-conducting behavior.

Half-Heusler alloys based on the systems XNiSn and XCoSb (X=Zr, Hf, Ti) are of interest for thermoelectric applications, because they have a high Seebeck coefficient and a high electrical conductivity. They have, however, relatively high thermal conductivity values as well, so that the ZT value of purely ternary compounds is limited.

In order to increase the ZT value of the half-Heusler alloys, their properties can be modified in a controlled manner by substitutions on all three sublattices. An example for this is the alloy TiNiSn, in which thermal conductivity can be reduced and electric conductivity can be increased by substituting the Ti location by Hf and Zr and the Sn location by Sb.

SUMMARY

In order to provide thermoelectric objects for thermoelectric conversion devices which can be realized in practice, suitable production methods are desirable.

An object of an embodiment of the invention is therefore to provide a method for producing thermoelectric objects with which thermoelectric objects can be produced on an industrial scale.

This is solved by the subject matter of the independent claim. Further developments are subject matter of the respective dependent claims.

A method for producing a thermoelectric object for a thermoelectric conversion device is provided, comprising the following. A starting material is provided which has elements in the ratio of a half-Heusler alloy described by the formula $\alpha\beta\chi$, wherein $\alpha$ is one or more of the elements of the group consisting of Ti, Zr and Hf, $\beta$ is Co or Ni and $\chi$ is Sn and/or Sb, wherein the composition is described by $Zr_a Hf_b Ti_c NiSn_{1-d} Sb_d$ or $Zr_a Hf_b Ti_c CoSb_{1-e} Sn_e$, wherein $0 \leq a \leq 0.8$, $0 \leq b \leq 0.8$, $0 \leq c \leq 0.8$, $0 \leq d \leq 0.1$ and $0 \leq e \leq 0.3$ and the sum $(a+b+c)=1$.

The starting material is melted and then cooled to form at least one ingot. The ingot is homogenized at a temperature of 1000° C. to 1400° C. for a period of time t, wherein 0.5 h≤t<12 h or 24 h<t<100 h, in order to produce a homogenized ingot. The homogenized ingot is crushed to form a powder, which is ground. The powder is cold-pressed, whereby a green body is which is sintered for 0.5 to 24 hours at a temperature of 1000° C. to 1500° C. under a maximum pressure of 1 MPa, whereby a thermoelectric object is produced.

The formula $\alpha\beta\chi$ identifies the ideal stoichiometry of 1:1:1. In practice, however, there may be deviations from this ideal stoichiometry, for example up to ±10%. These deviations are thus included herein in the formula $\alpha\beta\chi$.

The sum of the valence electrons of a half-Heusler alloy having a high thermoelectric effect is theoretically 18. In practice, however, deviations from this value are possible, so that a range of 17.5 to 18.5 is specified here.

A thermoelectric object in the form of a sintered ingot with a half-Heusler phase is produced by this method. The method is based on industrial scale processes and, by means of the powder metallurgical methods of grinding, cold-pressing and sintering, allows the production of objects of different shapes. Consequently, objects of a suitable shape and size can be produced for various different thermoelectric conversion devices.

Here, sintering process or sintering denotes a heat treatment with which a sintering of grains is achieved and which does not occur under high external pressure. For example, the heat treatment may occur under an external pressure of less than 1 MPa or 10 bar. A hot pressing method is thus excluded, because a higher external pressure on the green body is used during the heat treatment.

A sintering method further allows the produced object to be produced with dimensions which approach its final contours, so that a practical working component for a thermoelectric conversion device can be realized with little to no further machining.

The starting material has elements in ratios from which the composition of a half-Heusler alloy can be formed. The starting material may have pure elements or precursor alloys comprising two or more elements.

The ingot is heat-treated to produce a homogenized ingot. The purity of the half-Heusler alloy can be increased by means of this heat treatment, so that further non-half-Heusler alloy phases can be reduced.

In addition to the desired half-Heusler phase, a plurality of foreign phases are typically present in VIM-melted half-Heusler compounds. The homogenization of the compound may also be achieved in shorter times, for example from 0.5 h to 12 h, if higher aging temperatures between 1000° C. and 1400° C. are used. The ingot of the compound can be aged for homogenization in this temperature range for at least one hour, whereby the foreign phases are dissolved and the sintering ability of the compound is improved. The aging occurs in an inert gas atmosphere (e.g. argon) or a vacuum. Instead of a separate process step, the aging of the casted ingot may also be carried out as a holding stage in the cooling of the melt.

Shorter aging times from 0.5 h to 12 h at 1000° C. to 1400° C. can lead to lower production costs, since the energy consumption can be reduced for the homogenization step.

Longer aging times from 24 h to 1000 h can be used to increase still further the proportion of half-Heusler alloy phases in the ingot.

This heat treatment for the homogenization of the ingot can further have an effect on the lower limit of the sintering temperature, which can be used to densely sinter the green body produced from the powder obtained from the ingot. In particular, the sintering temperature and sintering duration can be reduced, if the heat treatment is carried out at a temperature above 1000° C. A lower sintering temperature can reduce production costs, because the power consumption of the sintering process is reduced by the lower sintering temperature.

The starting material and the half-Heusler alloy of the thermoelectric object which is produced therefrom can have various compositions.

While this specification discloses specific half-Heusler alloys having the composition $Zr_aHf_bTi_cNiSn_{1-d}Sb_d$ or $Zr_aHf_bTi_cCoSb_{1-e}Sn_e$, wherein 0≤a≤0.8, 0≤b≤0.8, 0≤c≤0.8, 0≤d≤0.1 and 0≤e≤0.3 and the sum (a+b+c)=1, the method can be used to produce half-Heusler alloys of other compositions.

A further method for producing a thermoelectric object for a thermoelectric conversion device comprises the following. A starting material is provided which has elements in the ratio of a half-Heusler alloy described by the formula $\alpha\beta\chi$, wherein $\alpha$ is one or more of the group consisting of Sc, Ti, V, Cr, Mn, Y, Zr, Nb, La, Hf, Ta and one or more of the rare earths, $\beta$ is one or more of the group consisting of Fe, Co, Ni, Cu and Zn, $\chi$ is one or more of the group consisting of Al, Ga, In, Si, Ge, Sn, Sb and Bi, and the sum of the valence electrons is between 17.5 and 18.5. The starting material is melted and then cooled to form at least one ingot. The ingot is homogenized at a temperature of 1000° C. to 1400° C. for a period of time t, wherein 0.5 h≤t<12 h or 24 h<t<100 h, in order to produce a homogenized ingot. The homogenized ingot is crushed to form a powder, which is ground. The powder is cold-pressed, whereby a green body is which is sintered for 0.5 to 24 hours at a temperature of 1000° C. to 1500° C. under a maximum pressure of 1 MPa, whereby a thermoelectric object is produced.

In one embodiment, the half-Heusler alloy has a composition of $\alpha Ni_{1-y}\beta_y Sn_{1-z}\chi_z$, wherein $\alpha$ is one or more of the group consisting of Zr, Hf and Ti, $\beta$ is one or more of the group consisting of Fe, Co, Cu and Zn and $\chi$ is one or more of the group consisting of Al, Ga, In, Si, Ge, Sb and Bi, wherein 0≤y≤0.9 and 0≤z≤0.3.

In a further embodiment, the half-Heusler alloy has a composition of $\alpha Co_{1-y}\beta_y Sb_{1-z}\chi_z$, wherein $\alpha$ is one or more of the group consisting of Zr, Hf and Ti, $\beta$ is one or more of the group consisting of Fe, Ni, Cu and Zn and $\chi$ is one or more of the group consisting of Al, Ga, In, Si, Ge, Sn and Bi, wherein 0≤y≤0.9 and 0≤z≤0.3.

In one embodiment, the half-Heusler alloy has a composition based on XNiSn or XCoSb, wherein X is one or more of the elements of the group consisting of Zr, Hf and Ti.

In one embodiment, the half-Heusler alloy has Ti and Zr and Hf. In one embodiment, the half-Heusler alloy is XNiSn, and a portion of the Sn is replaced by Sb. By selecting the elements for X and replacing a portion of Sn by Sb, the ZT value can be increased and the efficiency of the conversion of heat into electric energy can be improved.

Elements in the ratio of 0.25 Zr:0.25 Hf:0.5 Ti:1 Ni:0.998 Sn:0.002 Sb or 0.5 Zr:0.5 Hf:1 Co:0.8 Sb:0.2 Sn may be provided as the starting material.

In one embodiment, the ingot is formed by casting. The molten starting material is thus then casted into an ingot or casted ingot. The casted ingot is also known as an ingot mold. The ingot may be first cooled below 1000° C. For example, the ingot may be cooled to room temperature and only later heat-treated or homogenized by a heat treatment, which takes place at a temperature of 1000° C. to 1400° C. for a period of time t, wherein 0.5 h≤t<12 h or 24 h<t<100 h.

In one embodiment, the ingot is cooled from the temperature of the molten source material to the homogenization temperature of 1000° C. to 1400° C.

The homogenization can be carried out through a slow cooling rate in a temperature range from 1400° C. to 1000° C.

In one embodiment, the starting material has a weight of at least 5 kg. The ingot can be crushed into powder and ground in several steps. The ingot may for example be crushed by means of a jaw crusher. The crushed ingot can be ground in a mill to produce a coarse powder. After the grinding process to a coarse powder, a portion of powder can form in a sieve of the mill. This portion of powder is ground in a further grinding process. These steps can be repeated as required, until the average particle size of the powder is reduced to a predetermined desired value. In such a method, the whole of the material can be provided as a powder with the desired maximum particle size. The coarse powder can for example be produced by means of a disc mill.

In a further embodiment, the ingot is crushed to a coarse powder, and this coarse powder is ground to a fine powder in a further grinding process. Through this method, particle size can be reduced further. The fine powder is cold-pressed to form a green body. The fine powder can be produced by means of a planetary ball mill or a jet mill.

In one embodiment, after grinding, both the coarse powder and the fine powder are mixed. The mixture can be used to homogenize the fine powder or the composition thereof. This mixing may involve rotation, translation and inversion.

The starting material can be melted by means of vacuum induction melting (VIM). A vacuum induction melting process allows large quantities of starting material to be melted in one melting operation and is therefore suitable for industrial-scale processes.

The pressure in cold pressing can be optimized. In one embodiment, the fine powder is cold-pressed at a pressure of 1 t/cm$^2$ to 10 t/cm$^2$ (tonnes per square centimeter). An increased pressure can lead to a reduction of sintering temperature, at which a high density, for example of at least 95% of theoretical density, can be achieved.

The ingot is homogenized at a temperature of at least 1000° C. to 1400° C. for a period of time t, wherein 0.5 h≤t<12 h or 24 h<t<100 h, typically in an inert gas or in a vacuum. This heat treatment can be carried out such that the proportion of the half-Heusler phase in the ingot is increased. The heat treatment conditions can be selected such that after the homogenization treatment, no reflexes of foreign phases can be seen in a θ–2θ diffractogram.

In a further embodiment, the ingot is heat-treated at a temperature of 1050° C. to 1180° C. for a period of time t, wherein 0.5 h≤t<12 h or 24 h<t<100 h or 12 h to 24 h, in order to homogenize the ingot.

The ingot and/or the green body can be heat-treated or sintered in an inert gas or a vacuum. Argon, helium, hydrogen or forming gas may be used for example as an inert gas. An inert gas and a vacuum prevents the oxidation of the ingot or green body.

The sintering behavior of the half-Heusler alloy is influenced by the homogenization heat treatment. In particular, the sintering temperature can be reduced compared to an ingot which has not been heat-treated or has been heat-treated at a temperature below 1000° C., whereby a high density of at least 95% of the theoretical density is still obtained.

In addition, the sintering temperature can be adjusted depending on the composition of the half-Heusler alloy. The sintering temperature is, for example, dependent on the titanium content. A suitable sintering temperature for a composition without titanium is approximately 1400° C., and for a composition with a high proportion of titanium, a suitable sintering temperature is lower, for example approximately 1200° C.

The object produced using the above method can have a shape which is suitable for a working component of a thermoelectric conversion device. Alternatively, the object can be worked further in order to produce a working component. In one embodiment, the thermoelectric object is processed into a plurality of working components by means of sawing and/or grinding processes.

The sawing process may be carried out by wire sawing, center hole sawing, wire spark erosion, water jet cutting and/or laser cutting. The grinding process may be carried out by means of disc grinding, double disc grinding, belt grinding and/or with a flat grinding machine.

An economical production method for thermoelectric half-Heusler alloys, which can be implemented on an industrial scale and which includes melting by means of widely available VIM technology, the grinding of the ingot and the sintering of the powder by means of cold pressing and sintering, is therefore made available.

One advantage of the method described lies in its scalability to an industrial scale and its economic viability. This is achieved by using the conventional and widely available VIM technology, through the realization of markedly shorter aging times for the homogenization treatment of the casted ingots and by using the easily scalable sintering method through cold pressing and sintering.

In summary, one embodiment provides a method for producing thermoelectric half-Heusler alloys having the following process steps:

The alloying elements are first melted by means of vacuum induction melting, and the alloy can then be cast as one or more ingots.

The ingot or casted ingot is processed in several steps by means of various comminution and grinding methods (e.g. jaw crusher, disc mill, ball mill, jet mill), into a powder with an average value and median of the particle size distribution of less than 10 µm.

In order to obtain a homogeneous distribution of the powder and to eliminate any fluctuations in the composition of various powder fractions, the powder can be homogenized by mixing using suitable methods (e.g. in a Turbula mixer) after the various grinding steps.

Using a pressing method, the powder is then compacted to form green bodies. Tool pressing or isostatic pressing may be used, for example, as suitable pressing methods. The pressure lies here between 1 t/cm² and 10 t/cm², wherein green densities of more than 50% of the theoretical density are achieved.

In the subsequent sintering step, the green bodies are sintered at temperatures between 1000° C. and 1500° C. in an inert atmosphere (e.g. argon or vacuum), whereby sintered bodies with a density of more than 95% of the theoretical density are obtained. The exact sintering temperature here is to be adapted to the composition of the half-Heusler alloy.

In addition to the desired half-Heusler phase, VIM-melted half-Heusler alloys can typically contain a plurality of foreign phases. It was found that the homogenization of the alloy is achieved in less time if higher aging temperatures are used. Following one of the above process steps, the alloy can therefore be aged for homogenization at temperatures between 1000° C. and 1400° C. for times between 0.5 h and 100 h, whereby the foreign phases are dissolved and the half-Heusler phase is maintained as predominant phase. The aging occurs in an inert gas atmosphere, e.g. argon.

Certain embodiments, examples and comparative examples will now be explained in more detail with reference to the drawings.

DETAILED DESCRIPTION OF SPECIFIC EMBODIMENTS

Various methods for producing a thermoelectric object suitable for a thermoelectric conversion device will now be described which are suitable for industrial scale production. In particular, a starting material is melted by means of vacuum induction melting (VIM) and then cast to produce a cast ingot. The cast ingot produced in this way is crushed and ground in several steps to produce a powder from the cast ingot. The powder is cold-pressed and sintered to produce sintered samples. These sintered samples can be used as thermoelectric components in thermoelectric conversion devices. In a further embodiment, the sintered samples are processed further in order to match their shape to the application. The samples are, for example, sawn to produce a plurality of working components from the sample.

The thermoelectric object is formed from a half-Heusler alloy. Described below are four embodiments and two comparative examples with a half-Heusler alloy of a (Zr, Hf, Ti) NiSn-type and four embodiments with a half-Heusler alloy of a (Zr, Hf, Ti) CoSb-type.

Embodiment 1

An ingot of the half-Heusler alloy with a composition of $Zr_{0.25}Hf_{0.25}Ti_{0.5}NiSn_{0.998}Sb_{0.002}$ is produced by means of vacuum induction melting. For charging the furnace, the elements are weighed in in accordance with their proportions in the alloy. The furnace is evacuated to a vacuum of 0.1 mbar or better and then heated up. After complete melting of the complete charge, an atmosphere of 800 mbar argon is set, and the melt is cast into a copper mold.

A portion of the ingot produced in this way is pre-crushed by means of a jaw crusher and then processed in a disc mill into a coarse powder with a maximum particle size of 315 μm. For this purpose, the material to be ground passes through the disc mill in several steps. After each step, the fraction of the powder with a particle size of less than 315 μm is separated out by means of a sieve with a mesh width of 315 μm. The fraction which does not pass through the sieve passes through the disc mill with a reduced grinding gap in the next step, until the whole of the material is present as a powder with a particle size of less than 315 μm. The powder is then mixed in a Turbula mixer for 30 minutes and thereby homogenized.

Figure 1:
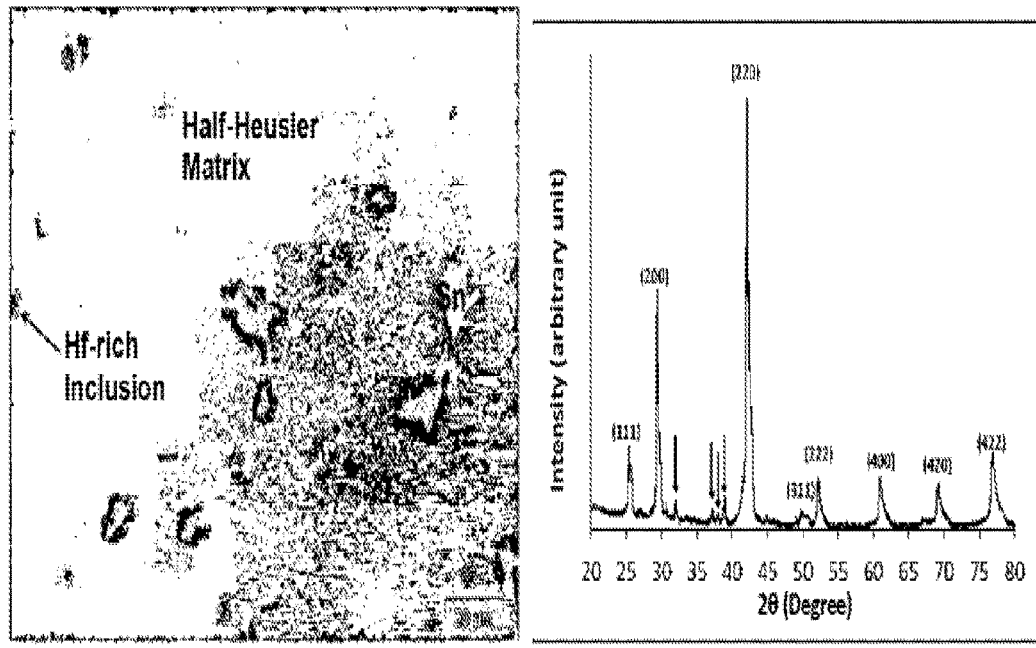
FIG. 1 shows a light-micrograph and an X-ray diffractogram of a cast ingot from $Zr_{0.25}Hf_{0.25}Ti_{0.5}NiSn_{0.998}Sb_{0.002}$ according to a first embodiment.

To analyze the alloy in the cast state, light microscope micrographs of the cast structure and an X-ray diffractogram of the ground casted ingot after its passage through the disc mill were produced. These are shown in FIG. 1, wherein a light microscope micrograph of the structure and a corresponding X-ray diffractogram (Cu-Ku-radiation) of the cast ingot from the alloy $Zr_{0.25}Hf_{0.25}Ti_{0.5}NiSn_{0.998}Sb_{0.002}$ produced in embodiment 1 are shown. In the X-ray diffractogram, the Miller indices mark the reflexes of the half-Heusler phase. The arrows indicate reflexes associated with foreign phases.

As can be seen in FIG. 1, the cast structure contains several foreign phases in addition to the matrix of the half-Heusler phases. By way of example, FIG. 1 shows foreign phases consisting of Hf-rich inclusions (dark grey) and islands of non-dissolved Sn (white).

The existence of the foreign phases can also be seen in the X-ray diffractogram of FIG. 1. In the angle range between 30°<2θ<40°, the reflexes associated with foreign phases are marked by arrows. The remaining reflexes can be assigned to the half-Heusler phase in accordance with the indices specified in FIG. 1. Here, all indexed reflexes have a shoulder in the direction of higher diffraction angles. This shoulder is due to a reflection split, because the half-Heusler alloy of the composition $Zr_{0.25}Hf_{0.25}Ti_{0.5}NiSn_{0.998}Sb_{0.002}$ is segregated into at least two half-Heusler phases of different lattice constants, as disclosed in U.S. Pat. No. 7,745,720. The resulting splitting of the reflexes can also be seen in the following diffractograms.

To produce the sintered samples, a portion of the coarse powder with the particle size ≤315 μm is ground further in a planetary ball mill to a finer powder with a median particle size distribution of 2 μm. This powder was in turn mixed in a Turbula mixer for 30 minutes and homogenized. Subsequently, it was pressed under a pressure of 2.5 t/cm² into cylindrical green bodies with a diameter of approximately 9 mm.

The density of the green bodies obtained in this way amounted to 62% of theoretical density. The green bodies were sintered in a furnace under argon as inert gas at temperatures between 1140° C. and 1220° C. The furnace was heated here to sintering temperature at a heating rate of 10 K/min, and the dwell time at sintering temperature was 1 hour.

Figure 2:
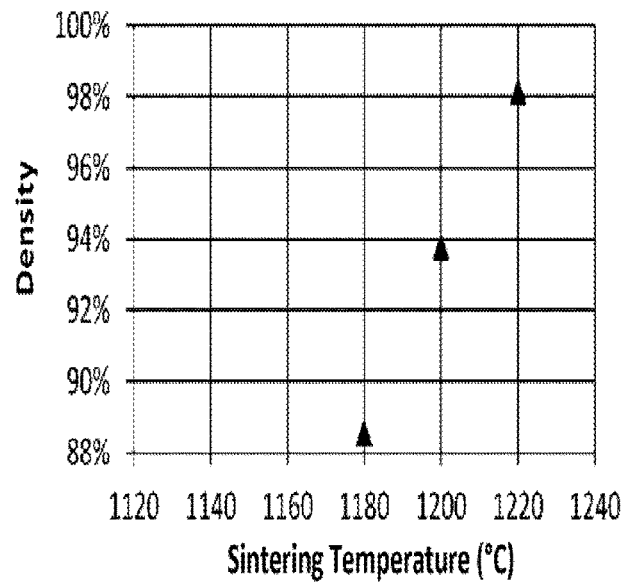
FIG. 2 shows a graph of the density of sintered samples from the cast ingot of the first embodiment as a function of sintering temperature.

FIG. 2 shows a graph of the density of sintered samples from the cast ingot of the first embodiment as a function of sintering temperature. As shown in FIG. 2, a dense sintered body with a density of more than 95% of the theoretical density of 8.23 g/cm³ can be achieved by the method described at a sintering temperature of 1220° C.

Embodiment 2

A cast ingot of the half-Heusler alloy with the composition $Zr_{0.25}Hf_{0.25}Ti_{0.5}NiSn_{0.998}Sb_{0.002}$ is produced by means of vacuum induction melting as described above in connection with the first embodiment.

In this second embodiment, the portion of the cast ingot which is to be processed further is first aged for 24 hours at 1050° C. in an argon atmosphere for homogenization. The processing of the aged cast ingot into powder then takes place as described above in connection with the first embodiment.

Figure 3:
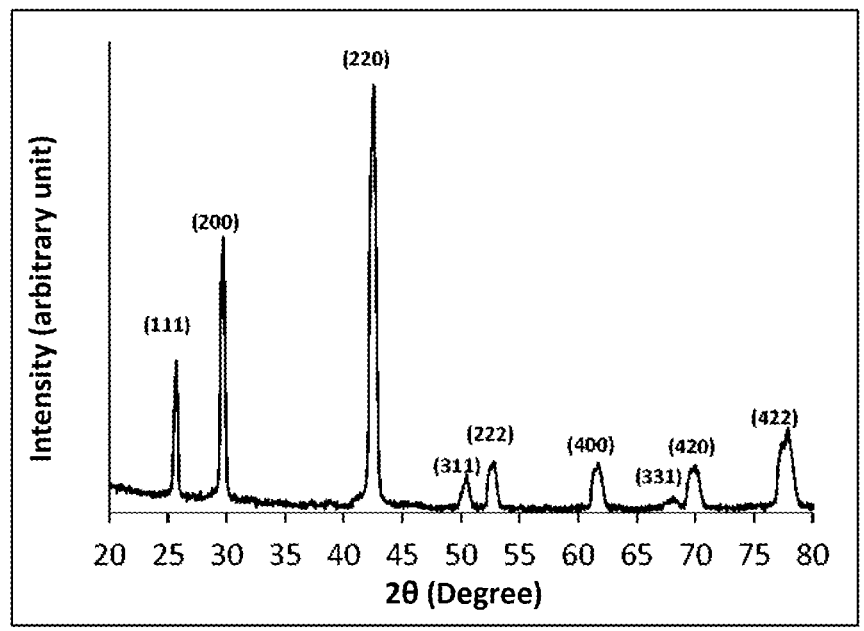
FIG. 3 shows an X-ray diffractogram of a homogenized cast ingot from $Zr_{0.25}Hf_{0.25}Ti_{0.5}NiSn_{0.998}Sb_{0.002}$ according to a second embodiment.

To assess the effectiveness of the aging treatment and heat treatment, an X-ray diffractogram as shown in FIG. 3 is produced from the powder with a particle size of ≤315 μm as produced by the disc mill. The indices mark the reflexes of the half-Heusler phase.

It is apparent from FIG. 3 that, after aging, no foreign phases can be detected by means of X-ray diffraction. Apart from the reflexes associated with the half-Heusler phase, no further reflexes are visible, in particular in the angle range between 30°<2θ<40°.

The powder produced from the aged casted ingot is pressed under a pressure of 2.5 t/cm² into rectangular green bodies with dimensions of approximately (17.2×10.4×5) mm³. The density of the green bodies is 62% of the theoretical density.

Samples are sintered at various temperatures and, afterwards, the density of the sintered samples is determined. The method described in connection with the first embodiment is used for sintering at various temperatures. The results of the sintering processes are represented in FIG. 4, which shows a graph of the density of the sintered samples as a function of sintering temperature.

Figure 4:
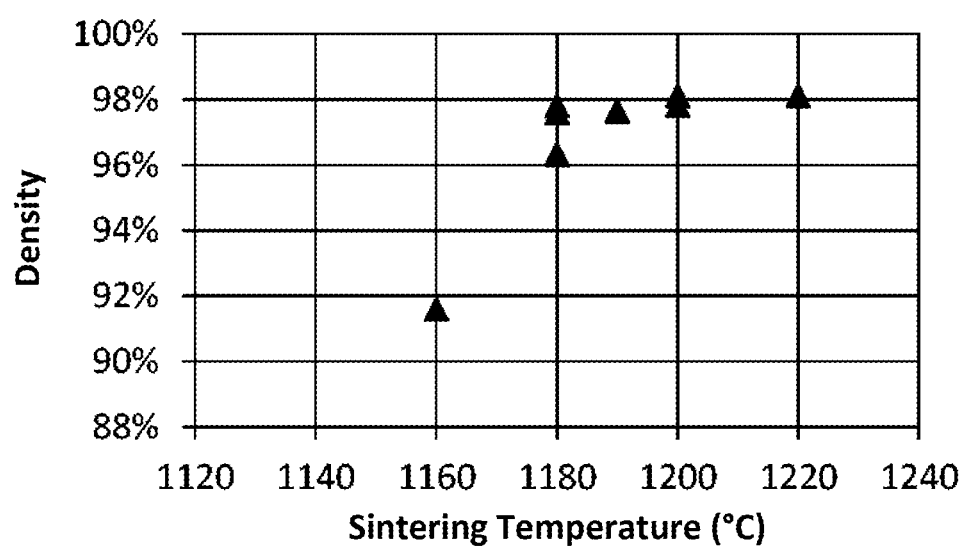
FIG. 4 shows a graph of the density of sintered samples from the cast ingot of the second embodiment as a function of sintering temperature.

It can be seen from FIG. 4 that, through the aging of the cast ingot before crushing and grinding into powder, the sintering temperature required for obtaining a density of more than 95% of the theoretical density can be reduced by 40° C. to 1180° C. as compared to the first embodiment, which is not heat-treated for homogenization.

Figure 5:
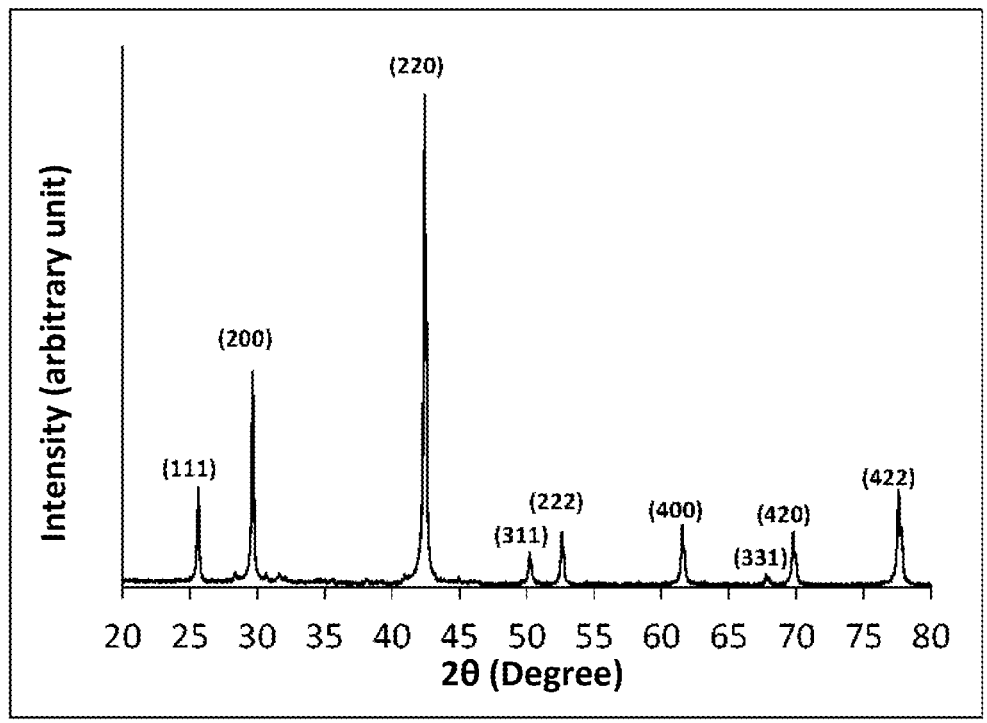
FIG. 5 shows an X-ray diffractogram of a sample of the second embodiment sintered at 1190° C.

An X-ray diffractogram as shown in FIG. 5 is taken for a sample produced in accordance with the second embodiment and which is sintered at 1190° C. Likewise, no foreign phases can be observed in the sintered sample by means of the X-ray diffractogram; the reflexes which can be seen can be attributed to the half-Heusler phase.

The method having a heat treatment for homogenizing the cast ingot before processing into a powder is therefore capable of producing dense and phase-pure sintered bodies of the half-Heusler alloy made from the powder. Furthermore, the sintering temperature at which a density of at least 95% of the theoretical density is achieved is reduced. This can reduce manufacturing costs.

Comparative Example 1

A cast ingot of the half-Heusler alloy with the composition $Zr_{0.25}Hf_{0.25}Ti_{0.5}NiSn_{0.998}Sb_{0.002}$ is produced as in embodiments 1 and 2 by means of vacuum induction melting.

The portion of the cast ingot which is to be processed further is subjected to a homogenization treatment at a temperature below 1000° C., namely at 900° C., for 72 hours in an argon atmosphere.

Figure 6:
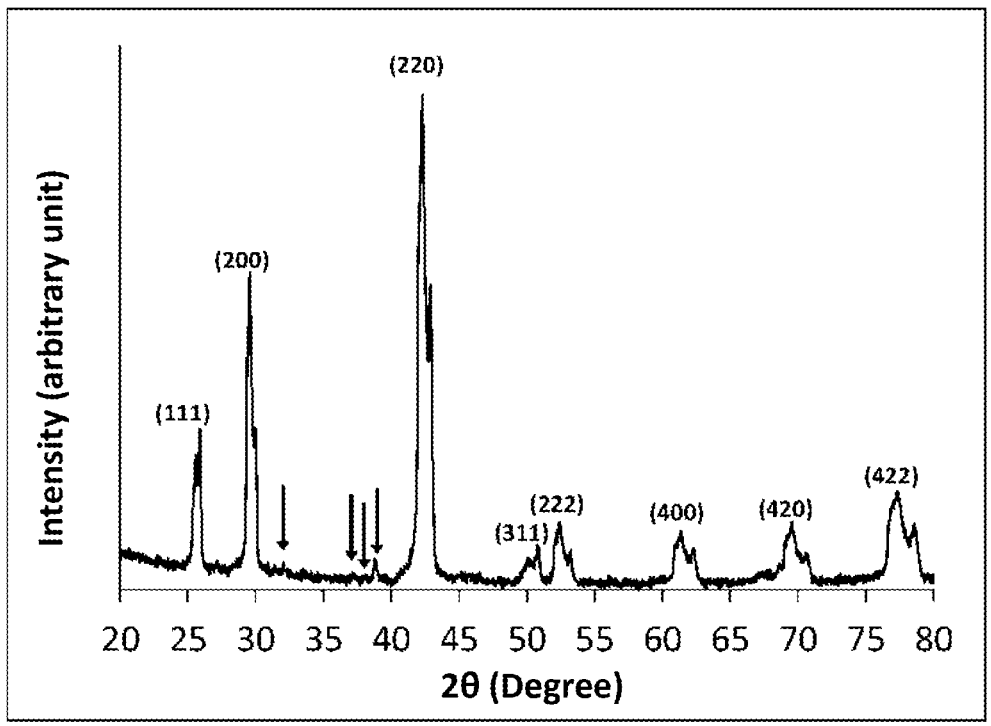
FIG. 6 shows an X-ray diffractogram of a first comparative example.

The cast ingot aged in this way is processed into a powder with a particle size of ≤315 μm by means of a jaw crusher and a disc mill. The X-ray diffractogram shown in FIG. 6 is produced from this powder. Although the intensity of the foreign phase reflexes already found in the cast state, which can be seen in FIG. 1, is reduced, the reflexes are nevertheless still clearly detectable. In contrast to an aging treatment at temperatures above 1000° C., aging treatment at temperatures below 1000° C. does not result in a complete homogenization of the half-Heusler alloy. Even at the longer aging time of 72 hours, a complete homogenization of the half-Heusler alloy is not achieved.

The coarse powder from the disc mill is, as in the first embodiment, processed further into a finer powder with a median particle size distribution of 2 μm and then pressed and sintered.

Samples are sintered at various temperatures and, afterwards, the density of the sintered samples is determined. The results of the sintering processes are represented in FIG. 7, which shows a graph of the density of the sintered samples as a function of sintering temperature.

Figure 7:
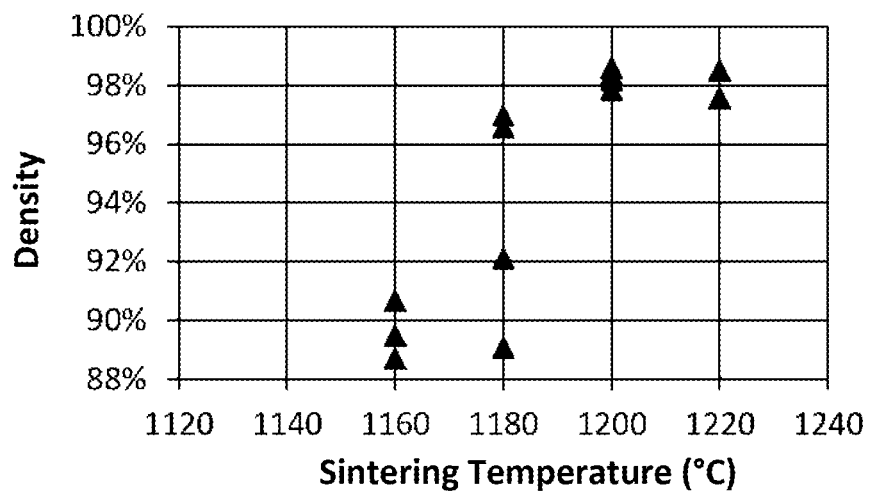
FIG. 7 shows a graph of the density of sintered samples of the first comparative example.

It is apparent from FIG. 7 that the aging treatment at 900° C. only allows the sintering temperature to be reduced by less than in the case of the second embodiment, regardless of the longer aging period. Constantly dense samples with a density above 95% of the theoretical density are only obtained at sintering temperatures from 1200° C. The density obtained at 1180° C., in contrast, varies strongly, with samples greater than 95% and less than 90% in outliers. Compared to this, the sintering temperature can reliably be reduced to 1180° C. in the case of the second embodiment, as a result of the 24 h aging process at 1050° C.

Embodiment 3

An ingot of the half-Heusler alloy with the composition $Zr_{0.25}Hf_{0.25}Ti_{0.5}NiSn_{0.998}Sb_{0.002}$ was produced as in the context of the second embodiment, aged and processed into a powder. The powder is pressed with a pressure of 6.3 t/cm² into rectangular green bodies with dimensions of approximately (17.2×10.4×4) mm³.

Figure 8:
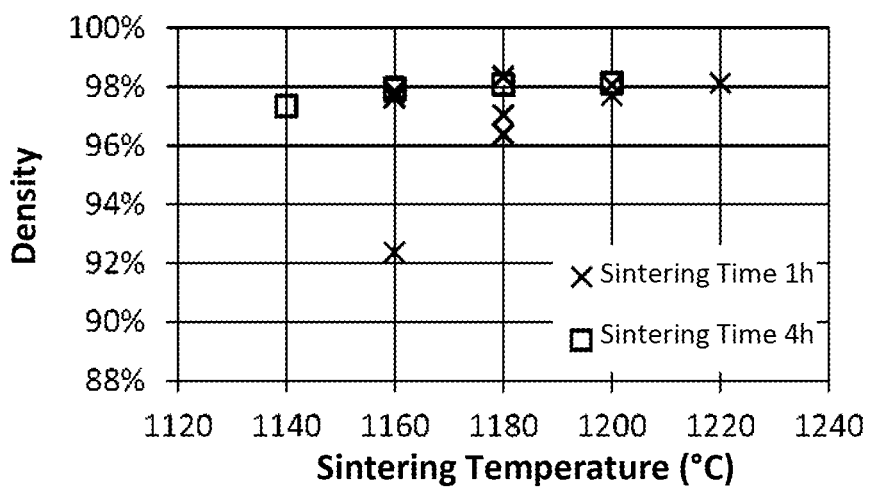
FIG. 8 shows a graph of the density of sintered samples from $Zr_{0.25}Hf_{0.25}Ti_{0.5}NiSn_{0.998}Sb_{0.002}$ according to a third embodiment as a function of sintering temperature and sintering time.

The density of the green bodies obtained in this way amounted to 68% of theoretical density. The subsequent sintering process was carried out as in the context of the first and second embodiments. The samples were sintered for 1 hour or 4 hours. The results of the sintering are represented in FIG. 8, which shows a graph of the density of the sintered samples as a function of sintering temperature and sintering time.

At a sintering time of one hour, the increased pressure did not lead to an improved result compared to the second embodiment, see FIG. 4, i.e. a sintering temperature of 1180° C. is still required for achieving samples with a density of above 95% of the theoretical density.

In contrast, at a sintering time of 4 hours, sintered bodies with a density greater than 95% of the theoretical density were obtained at a temperature of 1140° C. The sintering temperature can therefore be reduced further by at least 40° C., compared to the first embodiment, which is not heat-treated for homogenization and which in which a lower pressure is used in the cold pressing process.

Comparative Example 2

Figure 9:
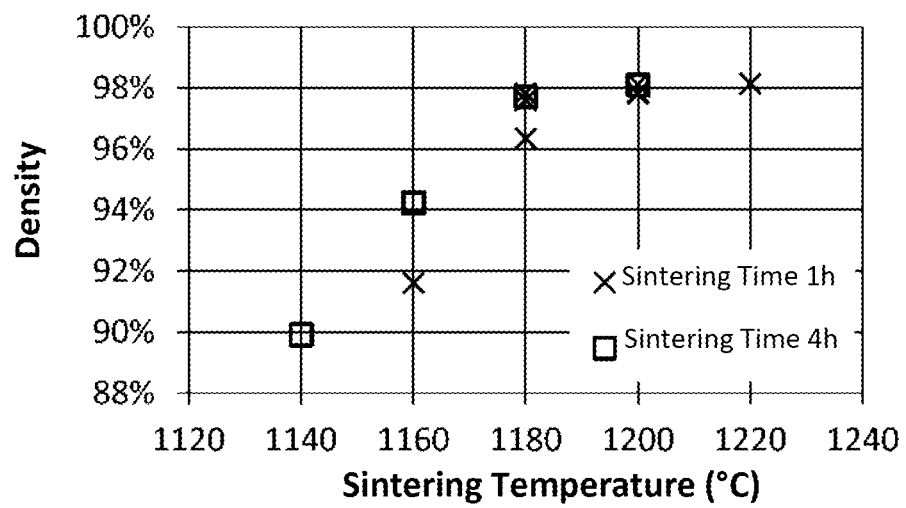
FIG. 9 shows a graph of the density of sintered samples according to a second comparative example as a function of sintering temperature and sintering time.

Green bodies from the second embodiment, which are produced with a pressure of 2.5 t/cm² and have a green density of 62% of the theoretical density, are, in addition to the sintering time of one hour used in the second embodiment, likewise sintered for four hours. The results of these tests are shown in FIG. 9. In contrast to the samples from the third embodiment, which are produced at an increased pressure, the extending of the sintering time did not result in a sufficiently dense sintered body at sintering temperatures below 1180° C. From the comparative example 2, it can thus be concluded that the increased pressure is responsible for this effect and that this effect can therefore not be attributed to the extending of the sintering time alone.

Embodiment 4

In a fourth embodiment, the sintering process takes place in a vacuum.

Figure 10:
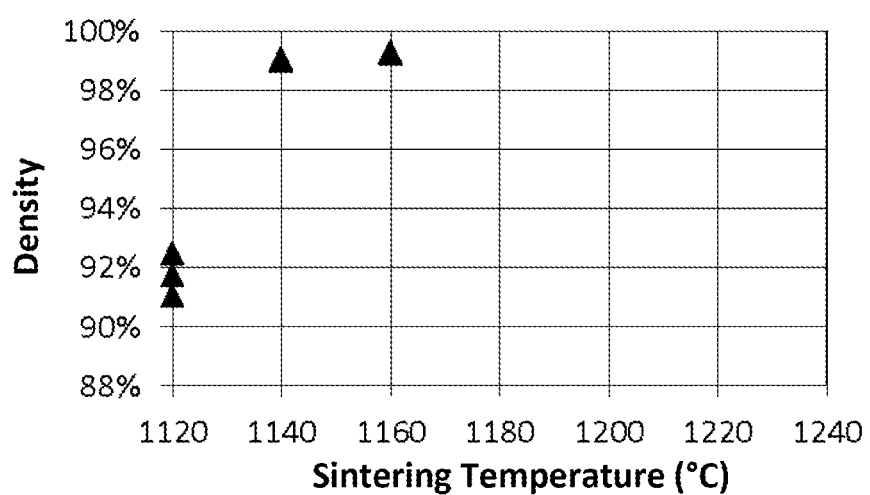
FIG. 10 shows a graph of the density of sintered samples from $Zr_{0.25}Hf_{0.25}Ti_{0.5}NiSn_{0.998}Sb_{0.002}$ according to a third embodiment as a function of sintering temperature.

An ingot of a half-Heusler alloy with the composition $Zr_{0.25}Hf_{0.25}Ti_{0.5}NiSn_{0.998}Sb_{0.002}$ is produced as in the context of the second embodiment, aged, processed into a powder and pressed into green bodies. The sintering of the green bodies is carried out for one hour in a vacuum at a maximum pressure of 5×10⁻² mbar. The results of the sintering tests are shown in FIG. 10. It can be seen therefrom that, through sintering in a vacuum, even higher densities of 99% of the theoretical density can be achieved in comparison with sintering under argon, see here FIG. 4. Furthermore, these high densities can be produced at a sintering temperature of 1140° C., which has again been reduced by up to 40° C.

XCoSb-based half-Heusler alloys are also produced in processes which are suitable for industrial-scale production.

Embodiment 5

A cast ingot of a half-Heusler alloy with the composition $Zr_{0.5}Hf_{0.5}CoSb_{0.8}Sn_{0.2}$ is accordingly produced by means of vacuum induction melting as in the context of the first embodiment and processed into a powder with a median particle size distribution of approximately 2 μm. This powder is pressed in a tool press with a pressure of 2.5 t/cm² into rectangular green bodies with dimensions of approximately (17.2×10.4×5) mm³ and a green density of 62% of the theoretical density.

The subsequent sintering is carried out with argon as inert gas at temperatures of 1350° C. and 1400° C. for 30 minutes and one hour, at a ramp rate of 10 K/min. As the results in Table 1 show, a dense sintered body with a density of more than 95% of the theoretical density of 9.16 g/cm³ is obtained at a temperature of 1400° C.

TABLE 1

| Sample | Sintering Time | Sintering Temperature | Density |
|---|---|---|---|
| 1 | 30 Min | 1400° C. | 95.4%, |
| 2 | 30 Min | 1400° C. | 95.0%, |
| 3 | 30 Min | 1400° C. | 95.2%, |
| 4 | 1 h | 1350° C. | 93.9%, |
| 5 | 1 h | 1400° C. | 95.8%, |

Table 1 shows the density of the alloy $Zr_{0.5}Hf_{0.5}CoSb_{0.8}Sn_{0.2}$ according to embodiment 4 after sintering at various temperatures and dwell times. The density is specified as a percentage of the theoretical density of 9.16 g/cm 3.

Embodiment 6

In the sixth embodiment, the cast ingot of $Zr_{0.5}Hf_{0.5}CoSb_{0.8}Sn_{0.2}$ is subjected to a heat treatment for homogenization. The half-Heusler alloy with the composition $Zr_{0.5}Hf_{0.5}CoSb_{0.8}Sn_{0.2}$ is produced as in the context of the fifth embodiment. In accordance with the second embodiment, however, the cast ingot is aged in an argon atmosphere for 24 hours at 1100° C. for homogenization before processing into powder.

Figure 11:
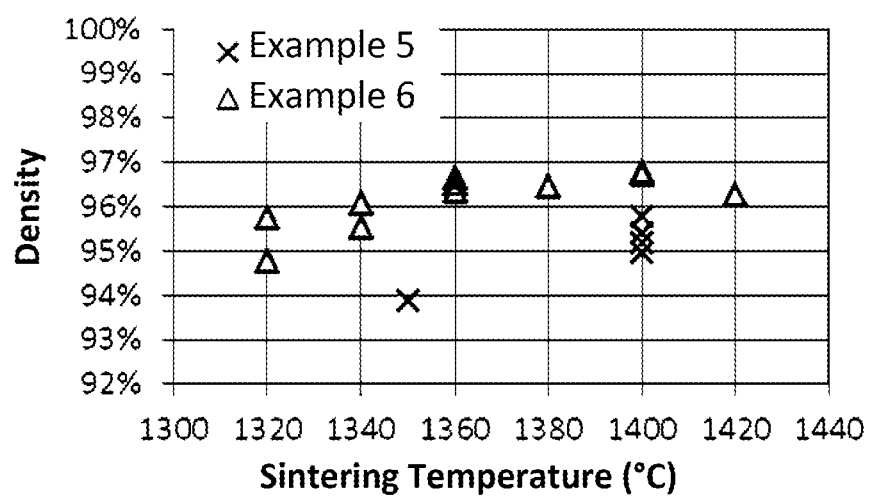
FIG. 11 shows a graph of the density of sintered samples from $Zr_{0.5}Hf_{0.5}CoSb_{0.8}Sn_{0.2}$ according to a fourth and fifth embodiment as a function of sintering temperature and sintering time.

After the powder has been pressed into green bodies, these are sintered for 30 minutes at various temperatures with argon as inert gas. The results of the sintering trials compared to the data from embodiment 5 are shown in FIG. 11.

For the half-Heusler alloy with the composition $Zr_{0.5}Hf_{0.5}CoSb_{0.8}Sn_{0.2}$, the aging treatment carried out on the cast ingot likewise results in a significantly increased sintering ability. Even at sintering temperatures of 1340° C., dense sintered bodies with a density greater than 95% of the theoretical density can be obtained as a result of the aging, while without aging, this result would require a temperature of 1400° C. Furthermore, significantly higher densities than in embodiment 5 are obtained in the temperature range between 1360° C. and 1420° C.

TABLE 2

| Embodiment | Compound | Theoretical Density (g/cm³) | Sintering Time (Min) | Sintering Temperature (° C.) | Density Obtained |
|---|---|---|---|---|---|
| 7 | $Ti_{0.5}Hf_{0.5}CoSb_{0.8}Sn_{0.2}$ | 8.9 | 30 | 1300 | 97.1%, |
|  |  |  | 30 | 1320 | 98.2%, |
|  |  |  | 30 | 1340 | 98.3%, |
| 8 | $Ti_{0.5}Zr_{0.5}CoSb_{0.8}Sn_{0.2}$ | 7.7 | 30 | 1300 | 96.3%, |
|  |  |  | 30 | 1320 | 97.8%, |
|  |  |  | 30 | 1340 | 98.1%, |

Embodiment 7

In the seventh embodiment, a cast ingot of a half-Heusler alloy with the composition $Ti_{0.5}Hf_{0.5}CoSb_{0.8}Sn_{0.2}$ is produced by means of vacuum induction melting, aged for 24 h at 1100° C. for homogenization, processed into a powder and pressed into green bodies. The green bodies were then sintered for 0.5 hours at 1300° C., 1320° C. and 1340° C. The composition and the measured density of these samples are shown in Table 2. For each temperature, the method described produces sintered bodies with a density of more than 95% of the theoretical density. This density increases with sintering temperature, so that at a temperature of 1340° C., the sample has 98.2% of the theoretical density.

Embodiment 8

In the eighth embodiment, a cast ingot of a half-Heusler alloy with the composition $Ti_{0.5}Zr_{0.5}CoSb_{0.8}Sn_{0.2}$ is produced by means of vacuum induction melting, aged for 24 h at 1100° C. for homogenization, processed into a powder and pressed into green bodies. The green bodies were then sintered for 0.5 hours at 1300° C., 1320° C. and 1340° C. The composition and the measured density of these samples are shown in Table 2. For each temperature, the method described produces sintered bodies with a density of more than 95% of the theoretical density. This density increases with sintering temperature, so that at a temperature of 1340° C., the sample has 98.4% of the theoretical density.

In embodiments 9 and 10, a shorter time of 1 hour is used for homogenization. A density of above 95% of the theoretical density is obtained in the sintered object.

TABLE 3

| Embodiment | Compound | Theoretical Density (g/cm³) | Sintering Time (Min) | Sintering Temperature (° C.) | Density Obtained |
|---|---|---|---|---|---|
| 9 | $Zr_{0.5}Hf_{0.5}CoSb_{0.8}Sn_{0.2}$ | 9.2 | 4 | 1320 | 97.0%, |
|  |  |  | 4 | 1340 | 98.9%, |
|  |  |  | 4 | 1350 | 99.7%, |
| 10 | $Zr_{0.4}Hf_{0.6}NiSn_{0.98}Sb_{0.02}$ | 9.6 | 4 | 1320 | 94.8%, |
|  |  |  | 4 | 1340 | 96.4%, |
|  |  |  | 4 | 1350 | 97.2%, |

Embodiment 9

A cast ingot of the half-Heusler alloy with the composition $Zr_{0.5}Hf_{0.5}CoSb_{0.8}Sn_{0.2}$ is produced by means of vacuum induction melting, aged for 1 h at 1100° C. for homogenization, processed into a powder with a median particle distribution of approximately 5 µm and pressed to form green bodies. The green bodies are subsequently sintered for 4 hours in a vacuum at a maximum pressure of $5 \times 10^{-2}$ mbar at different temperatures, namely 1320° C., 1340° C. and 1350° C. The densities of the sintered samples are shown in Table 3. Densities greater than 95% of the theoretical density can be obtained from a sintering temperature of 1320° C.

Embodiment 10

A cast ingot of the half-Heusler alloy with the composition $Zr_{0.4}Hf_{0.6}NiSn_{0.98}Sb_{0.02}$ is produced by means of vacuum induction melting, aged for 1 h at 1100° C. for homogenization, processed into a powder with a median particle distribution of approximately 5 µm and pressed to form green bodies. The green bodies are each subsequently sintered for 4 hours in a vacuum at a maximum of $5 \times 10^{-2}$ mbar at 1320° C., 1340° C. and 1350° C. The densities of the sintered samples are shown in Table 3. Densities greater than 95% of the theoretical density can be obtained from a sintering temperature of 1340° C.

The manufacturing processes described herein are based on the use of industrial scale processing methods, such as vacuum induction melting, cold pressing and sintering. With these methods, half-Heusler alloys can be produced in industrial quantities. If the cast ingot is subjected to a heat treatment at a temperature between 1000° C. and 1400° C., the sintering temperature for the cold pressed samples, in which a high density is obtained, can be reduced. The sintering method may be carried out at a pressure of less than 1 MPa, for example without external pressure, in order to obtain a density in the sintered object of more than 95% of the theoretical density. Objects produced thereby are suitable for use as thermoelectric objects in thermoelectric conversion devices, as they can be produced cost-effectively in large quantities and in varying shapes by means of the production method described herein.

The invention claimed is:

1. A method for producing a thermoelectric object for a thermoelectric conversion device, comprising:
providing a starting material which has elements in the ratio of a half-Heusler alloy described by the formula $\alpha\beta\chi$, wherein $\alpha$ is one or more of the group consisting of Sc, Ti, V, Cr, Mn, Y, Zr, Nb, La, Hf, Ta and one or more of the rare earths, $\beta$ is one or more of the group consisting of Fe, Co, Ni, Cu and Zn, $\chi$ is one or more of the group consisting of Al, Ga, In, Si, Ge, Sn, Sb and Bi, and the sum of the valence electrons is between 17.5 and 18.5,
melting of the starting material and subsequent cooling to form at least one ingot,
heat treating of the ingot at a temperature of 1000° C. to 1400° C. for a period of time t, wherein 0.5 h≤t<12 h or 24 h<t<100 h, in order to produce a homogenized ingot,
crushing the homogenized ingot to produce a crushed ingot,
grinding the crushed ingot, whereby a powder is produced, the powder having an average value and median particle size distribution of less than 10 µm,
cold pressing the powder with a pressure of 1 t/cm² to 10 t/cm², whereby a green body is produced, the green body having a density ranging from 62% to 68% of a theoretical density of the green body,
sintering the green body for 0.5 to 24 h at a temperature of 1000° C. to 1500° C. under a maximum pressure of 1 MPa, whereby a thermoelectric object is produced.

2. The method according to claim 1, wherein the half-Heusler alloy has a composition of $\alpha Ni_{1-y}\beta_y Sn_{1-z}\chi_z$, wherein $\alpha$ is one or more of the group consisting of Zr, Hf and Ti, $\beta$ is one or more of the group consisting of Fe, Co, Cu and Zn and $\chi$ is one or more of the group consisting of Al, Ga, In, Si, Ge, Sb and Bi, wherein 0≤y≤0.9 and 0≤z≤0.3.

3. The method according to claim 1, wherein the half-Heusler alloy has a composition of $\alpha Co_{1-y}\beta_y Sb_{1-z}\chi_z$, wherein $\alpha$ is one or more of the group consisting of Zr, Hf and Ti, $\beta$ is one or more of the group consisting of Fe, Ni, Cu and Zn and $\chi$ is one or more of the group consisting of Al, Ga, In, Si, Ge, Sn and Bi, wherein 0≤y≤0.9 and 0≤z≤0.3.

4. The method according to claim 1, wherein the half-Heusler alloy has a composition based on XNiSn or XCoSb, wherein X is one or more of the elements of the group consisting of Zr, Hf and Ti.

5. The method according to claim 4, wherein the half-Heusler alloy is XNiSn and a proportion of Sn is replaced by Sb.

6. The method according to claim 4, wherein the half-Heusler alloy comprises Ti and Zr and Hf.

7. The method according to claim 1, wherein elements in the ratio of 0.25 Zr:0.25 Hf:0.5 Ti:1 Ni:0.998 Sn:0.002 Sb or 0.5 Zr:0.5 Hf:1 Co:0.8 Sb:0.2 Sn are provided as the starting material.

8. The method according to claim 1, further comprising casting of the melted starting material into an ingot.

9. The method according to claim 1, wherein the ingot is first cooled below 1000° C. and then homogenized.

10. The method according to claim 1, wherein the ingot is cooled from the temperature of the melted starting material to a temperature of 1000° C. to 1400° C., at which temperature the ingot is homogenized.

11. The method according to claim 1, wherein the starting material has a weight of at least 5 kg.

12. The method according to claim 1, wherein the ingot is crushed by means of a jaw breaker.

13. The method according to claim 1, wherein the crushing of the homogenized ingot to a powder is carried out by means of a mill, wherein a proportion of powder forms in a sieve and this proportion of powder is ground in a further grinding process.

14. The method according to claim 1, wherein material is crushed by means of a disc mill.

15. The method according to claim 1, wherein the ingot is crushed to a coarse powder, the coarse powder is ground to a fine powder in a further grinding process, and the fine powder is cold-pressed.

16. The method according to claim 15, wherein the further grinding process is carried out by means of a planetary ball mill or a jet mill.

17. The method according to claim 1, wherein the powder is mixed after each passage through a mill.

18. The method according to claim 17, wherein the coarse powder or the fine powder is mixed using rotation, translation and inversion.

19. The method according to claim 1, wherein the starting material is melted by means of vacuum induction melting.

20. The method according to claim 1, wherein the green body is sintered in an inert gas or in a vacuum.

21. The method according to claim 1, wherein the ingot is homogenized under argon or in a vacuum.

22. The method according to claim 1, wherein the ingot is heat-treated at a temperature of 1050° C. to 1180° C. for a period of time t, wherein 0.5 h≤t<12 h.

23. The method according to claim 1, wherein the thermoelectric object is processed into a plurality of working components by means of sawing and/or grinding processes.

24. The method according to claim 23, wherein the sawing process is performed by means of wire sawing, center hole sawing, wire spark erosion, water jet cutting and/or laser cutting.

25. The method according to claim 23, wherein the grinding process is performed by means of disc grinding, double disc grinding, belt grinding and/or with a flat grinding machine.

26. The method according to claim 1, wherein heat treatment conditions of the homogenization step are selected such that after the homogenization step, no reflexes of foreign phases can be seen in the homogenized ingot in a theta −2 theta diffractogram.

* * * * *